(12) United States Patent
Mehlhorn

(10) Patent No.: US 7,042,192 B2
(45) Date of Patent: May 9, 2006

(54) SWITCH ASSEMBLY, ELECTRIC MACHINE HAVING THE SWITCH ASSEMBLY, AND METHOD OF CONTROLLING THE SAME

(75) Inventor: William L. Mehlhorn, Menomonee Falls, WI (US)

(73) Assignee: A.O. Smith Corporation, Milwaukee, WI (US)

( * ) Notice: Subject to any disclaimer, the term of this patent is extended or adjusted under 35 U.S.C. 154(b) by 0 days.

(21) Appl. No.: 11/081,165

(22) Filed: Mar. 16, 2005

(65) Prior Publication Data

US 2005/0156557 A1 Jul. 21, 2005

Related U.S. Application Data

(63) Continuation-in-part of application No. 10/615,815, filed on Jul. 9, 2003.

(51) Int. Cl.
*H02P 5/28* (2006.01)

(52) U.S. Cl. .............. 318/806; 318/727; 318/798; 318/809

(58) Field of Classification Search ........ 318/809, 318/798, 727, 799, 802, 785, 751, 781, 788, 318/779; 327/310, 110
See application file for complete search history.

(56) References Cited

U.S. PATENT DOCUMENTS

| | | |
|---|---|---|
| 3,116,445 A | 12/1963 | Wright |
| 3,226,620 A | 12/1965 | Elliott et al. |
| 3,530,348 A | 9/1970 | Conner |
| 3,562,614 A | 2/1971 | Gramkow |
| 3,566,225 A | 2/1971 | Poulsen |
| 3,573,579 A | 4/1971 | Lewus |
| 3,593,081 A | 7/1971 | Forst |
| 3,594,623 A | 7/1971 | Lamaster |
| 3,596,158 A * | 7/1971 | Watrous ............. 318/809 |
| 3,624,470 A | 11/1971 | Johnson |
| 3,652,912 A | 3/1972 | Bordonaro |
| 3,671,830 A | 6/1972 | Kruper |
| 3,761,792 A * | 9/1973 | Whitney et al. ......... 318/788 |
| 3,777,232 A | 12/1973 | Woods et al. |
| 3,792,324 A | 2/1974 | Saurez et al. |
| 3,800,205 A | 3/1974 | Zalar |
| 3,882,364 A | 5/1975 | Wright et al. |
| 3,913,342 A | 10/1975 | Barry |
| 3,916,274 A | 10/1975 | Lewus |
| 3,956,760 A | 5/1976 | Edwards |
| 3,976,919 A | 8/1976 | Vandevier et al. |
| 4,000,446 A | 12/1976 | Vandevier et al. |
| 4,021,700 A | 5/1977 | Ellis-Anwyl |
| 4,061,442 A | 12/1977 | Clark et al. |
| 4,143,280 A * | 3/1979 | Kuehn et al. ............. 290/9 |

(Continued)

OTHER PUBLICATIONS

Mehlhorn, U.S. Appl. No. 11/081,394, filed Mar. 16, 2005.

*Primary Examiner*—Paul Ip
(74) *Attorney, Agent, or Firm*—Michael Best & Friedrich LLP

(57) ABSTRACT

A compressor having a winding circuit and a driven member being driven in part by a winding of the winding circuit. The compressor further includes an auxiliary circuit connected in a parallel relationship with the winding circuit. The auxiliary circuit has an auxiliary circuit element and an electronic switch assembly connected in a series relationship such that the electronic switch assembly controls the current through the auxiliary circuit element.

18 Claims, 12 Drawing Sheets

U.S. PATENT DOCUMENTS

| | | |
|---|---|---|
| 4,182,363 A | 1/1980 | Fuller |
| 4,276,454 A | 6/1981 | Zathan |
| 4,303,203 A | 12/1981 | Avery |
| 4,307,327 A | 12/1981 | Streater et al. |
| 4,314,478 A | 2/1982 | Beaman |
| 4,366,426 A | 12/1982 | Turlej |
| 4,370,690 A | 1/1983 | Baker |
| 4,375,613 A | 3/1983 | Fuller et al. |
| 4,399,394 A | 8/1983 | Ballman |
| 4,409,532 A | 10/1983 | Hollenbeck et al. |
| 4,437,133 A | 3/1984 | Rueckert |
| 4,448,072 A | 5/1984 | Tward |
| 4,453,118 A | 6/1984 | Phillips et al. |
| 4,463,304 A | 7/1984 | Miller |
| 4,468,604 A | 8/1984 | Zaderej |
| 4,496,895 A | 1/1985 | Kawate et al. |
| 4,520,303 A | 5/1985 | Ward |
| 4,604,563 A | 8/1986 | Min |
| 4,605,888 A | 8/1986 | Kim |
| 4,622,506 A | 11/1986 | Shemanske et al. |
| 4,651,077 A | 3/1987 | Woyski |
| 4,658,195 A | 4/1987 | Min |
| 4,658,203 A | 4/1987 | Freymuth |
| 4,670,697 A | 6/1987 | Wrege et al. |
| 4,719,399 A | 1/1988 | Wrege |
| 4,751,449 A | 6/1988 | Chmiel |
| 4,751,450 A | 6/1988 | Lorenz et al. |
| 4,761,601 A | 8/1988 | Zaderej |
| 4,764,714 A | 8/1988 | Alley et al. |
| 4,782,278 A | 11/1988 | Bossi et al. |
| 4,786,850 A | 11/1988 | Chmiel |
| 4,801,858 A | 1/1989 | Min |
| 4,804,901 A * | 2/1989 | Pertessis et al. ............ 318/786 |
| 4,820,964 A | 4/1989 | Kadah et al. |
| 4,843,295 A | 6/1989 | Thompson et al. |
| 4,862,053 A | 8/1989 | Jordan et al. |
| 4,958,118 A | 9/1990 | Pottebaum |
| 4,967,131 A | 10/1990 | Kim |
| 4,975,798 A | 12/1990 | Edwards et al. |
| 5,017,853 A | 5/1991 | Chmiel |
| 5,041,771 A | 8/1991 | Min |
| 5,051,681 A * | 9/1991 | Schwarz ..................... 318/786 |
| 5,076,761 A | 12/1991 | Krohn et al. |
| 5,091,817 A | 2/1992 | Alley et al. |
| 5,103,154 A | 4/1992 | Dropps et al. |
| 5,145,323 A | 9/1992 | Farr |
| 5,164,651 A | 11/1992 | Hu et al. |
| 5,206,573 A | 4/1993 | McCleer et al. |
| 5,238,369 A | 8/1993 | Farr |
| 5,245,272 A | 9/1993 | Herbert |
| 5,247,236 A | 9/1993 | Schroeder |
| 5,296,795 A | 3/1994 | Dropps et al. |
| 5,302,885 A * | 4/1994 | Schwarz et al. ............ 318/781 |
| 5,423,214 A | 6/1995 | Lee |
| 5,444,354 A | 8/1995 | Takahashi et al. |
| 5,495,161 A | 2/1996 | Hunter |
| 5,512,809 A | 4/1996 | Banks et al. |
| 5,528,120 A | 6/1996 | Brodetsky |
| 5,532,635 A * | 7/1996 | Watrous et al. ............ 327/310 |
| 5,550,497 A | 8/1996 | Carobolante |
| 5,559,418 A | 9/1996 | Burkhart |
| 5,561,357 A | 10/1996 | Schroeder |
| 5,563,759 A | 10/1996 | Nadd |
| 5,589,753 A | 12/1996 | Kadah et al. |
| 5,592,062 A | 1/1997 | Bach |
| 5,618,460 A | 4/1997 | Fowler et al. |
| 5,654,620 A | 8/1997 | Langhorst |
| 5,689,168 A * | 11/1997 | Bogwicz et al. ............ 318/772 |
| 5,736,884 A | 4/1998 | Ettes et al. |
| 5,754,036 A | 5/1998 | Walker |
| 5,808,441 A * | 9/1998 | Nehring ..................... 318/751 |
| 5,814,966 A | 9/1998 | Williamson et al. |
| 5,818,708 A | 10/1998 | Wong |
| 5,821,727 A * | 10/1998 | Yura ......................... 318/809 |
| 5,892,349 A * | 4/1999 | Bogwicz et al. ............ 318/772 |
| 5,973,473 A * | 10/1999 | Anderson et al. ........... 318/785 |
| 6,222,355 B1 | 4/2001 | Ohshima et al. |
| 6,232,742 B1 | 5/2001 | Wacknov et al. |
| 6,236,177 B1 | 5/2001 | Zick et al. |
| 6,320,348 B1 | 11/2001 | Kadah |
| 6,329,784 B1 | 12/2001 | Puppin et al. |
| 6,356,464 B1 | 3/2002 | Balakrishnan et al. |
| 6,366,481 B1 | 4/2002 | Balakrishnan et al. |
| 6,411,481 B1 | 6/2002 | Seubert |
| 6,462,971 B1 | 10/2002 | Balakrishnan et al. |
| 6,496,392 B1 | 12/2002 | Odell |
| 6,499,961 B1 | 12/2002 | Wyatt et al. |
| 6,538,908 B1 | 3/2003 | Balakrishnan et al. |
| 6,643,153 B1 | 11/2003 | Balakrishnan et al. |
| 6,665,200 B1 * | 12/2003 | Goto et al. .................... 363/55 |
| 6,675,912 B1 | 1/2004 | Carrier |
| 6,687,141 B1 | 2/2004 | Odell |
| 6,700,333 B1 | 3/2004 | Hirshi et al. |
| 6,703,809 B1 * | 3/2004 | Royak et al. ................ 318/727 |
| 6,737,905 B1 | 5/2004 | Noda et al. |
| 6,761,067 B1 | 7/2004 | Capano |
| 6,794,921 B1 | 9/2004 | Abe et al. |
| 6,831,440 B1 * | 12/2004 | Royak et al. ................ 318/727 |
| 6,859,008 B1 * | 2/2005 | Seibel ........................ 318/799 |
| 2002/0101193 A1 | 8/2002 | Farkas et al. |
| 2002/0163821 A1 | 11/2002 | Odell |
| 2002/0172055 A1 | 11/2002 | Balakrishnan et al. |
| 2003/0034761 A1 | 2/2003 | Goto et al. |
| 2003/0048646 A1 | 3/2003 | Odell |
| 2003/0169015 A1 * | 9/2003 | Royak et al. ................ 318/727 |
| 2004/0071001 A1 | 4/2004 | Balakrishnan et al. |
| 2004/0080352 A1 | 4/2004 | Noda et al. |
| 2004/0095183 A1 | 5/2004 | Swize |
| 2004/0263111 A1* | 12/2004 | Royak et al. ................ 318/798 |
| 2005/0057212 A1* | 3/2005 | Harbaugh et al. .......... 318/809 |

\* cited by examiner

SWITCH ASSEMBLY, ELECTRIC MACHINE HAVING THE SWITCH ASSEMBLY, AND METHOD OF CONTROLLING THE SAME

RELATED APPLICATIONS

This application is a continuation-in-part of U.S. patent application Ser. No. 10/615,815, filed on Jul. 9, 2003, entitled SWITCH ASSEMBLY, ELECTRIC MACHINE HAVING THE SWITCH ASSEMBLY, AND METHOD OF CONTROLLING THE SAME, the content of which is incorporated herein by reference.

FIELD OF THE INVENTION

The present invention relates to an electronic switch assembly and, more particularly, an electronic switch assembly that controls current through a circuit.

BACKGROUND

Single-phase induction motors of the split phase and capacitor start types typically have the start winding connected to the power source when starting the motor. Once started, however, it is common to remove the start winding, resulting in the motor being more efficient. One reason for the removal of the start winding and start capacitor (if present) is that the start winding and the start capacitor are not typically designed for continuous duty. That is, these components will fail if left permanently in the circuit. A common solution to this problem is connecting a start switch in series with the start winding (and start capacitor) for controlling current through the start winding.

The most common implementation of a start switch for the above motors is a centrifugal switch mounted on the shaft of the motor. The centrifugal switch senses the shaft speed of the motor and opens the start winding contacts at the appropriate speed. This speed is typically around 75% to 80% of the rated running speed of the motor.

There are some problems associated with a motor including a centrifugal switch. Because the switch is opening an inductive load, a large spark occurs when the contacts open. This sparking pits the switch contacts and ultimately results in the switch failing. Another problem with the mechanical switch is that it must be adjusted in production to get an accurate switch-out speed. This is another step in the production process, which adds cost. Also, if adjustment difficulties arise, this step can slow production of the motor. Another frequently cited problem is that the switch must be mounted on the shaft of the motor and, thus, limits packaging options. The switch assembly adds length to the motor, which makes motor placement in tight quarters more challenging. A lesser problem is that the switch makes noise when it opens and closes. Some users may find the noise objectionable.

SUMMARY

One alternative to a motor including a centrifugal start switch is a motor having an electronic start switch. In one embodiment, the invention provides a new and useful electronic switch assembly used to control the current through a circuit. As used herein, a circuit is a conductor or system of conductors through which an electric current can or is intended to flow. An example circuit is the start winding and start capacitor (referred to herein as an auxiliary circuit) of a single-phase induction motor of the capacitor start type. However, the electronic assembly is not limited to induction motors of the capacitor start type.

In one construction of the electronic switch assembly, the assembly includes a power supply block, a switch control block, and a circuit control block. As used herein, a block is an assembly of circuits and/or components that function as a unit. The power supply block powers the electronic switch assembly. The switch control block includes an electronic switch and, generally speaking, opens (or closes) the switch based on a signal received from the circuit control block.

In another embodiment, the invention provides an electric machine (e.g., a motor) having a winding (e.g., a start winding) controlled by the electronic switch assembly. In yet another embodiment, the invention provides an electric machine having a capacitor (e.g., a start capacitor) controlled by the electronic switch assembly. For example, the electronic switch assembly can be used for controlling a start boost capacitor of a hermetically sealed compressor. It is envisioned that the electronic switch assembly can control other auxiliary circuits.

It is also contemplated that aspects of the electronic switch assembly can be used in other applications. For example, the electronic switch assembly can be used to control the motor of a sump pump. Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. The terms "connected," "coupled," and "mounted" and variations thereof herein are used broadly and, unless otherwise stated, encompass both direct and indirect connections, couplings, and mountings. In addition, the terms connected and coupled and variations thereof herein are not restricted to physical and mechanical connections or couplings.

Figure 1:
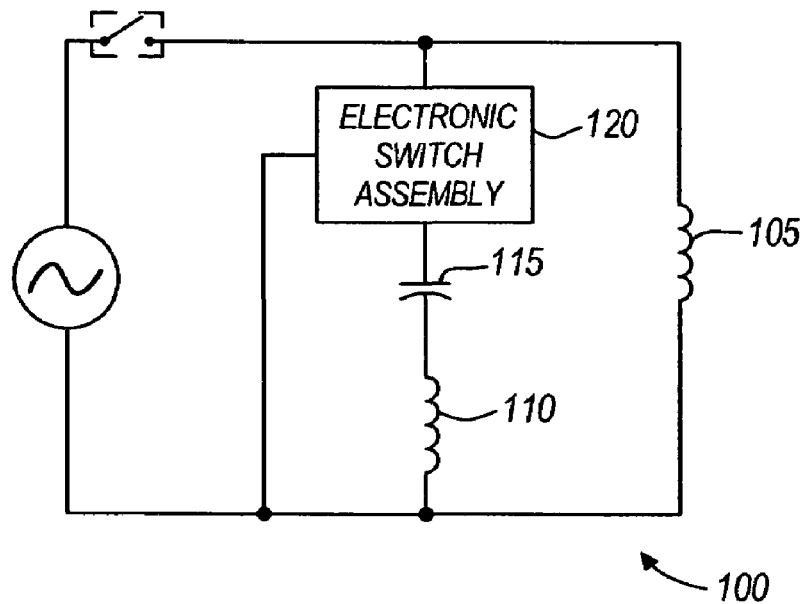
FIG. 1 is an electrical schematic of a motor including an electronic switch assembly.

FIG. 1 schematically represents a single-phase, capacitor start induction motor 100. The motor 100 includes a main winding 105, a start winding 110, a start capacitor 115, and an electronic switch assembly 120. Unless specified otherwise, the description below will refer to the motor 100. However, the invention is not limited to the motor 100. For example, the electronic switch assembly 120 described below can be used with a single-phase, split-phase induction motor; a capacitor-start, capacitor-run induction motor (an example of which will be discussed in connection with FIG. 8), and similar induction motors. It is also envisioned that the electronic switch assembly 120 (or aspects of the switch assembly 120) can be used with other motor types and other electric machines, where the electronic switch assembly 120 controls current through a circuit of the motor or machine. It is even envisioned that the electronic switch assembly 120 (or aspects of the switch assembly) can be used with any circuit, where the switch assembly 120 controls current through the circuit. For example, FIGS. 9–15 disclose a sump-pump controller that incorporates aspects of the electronic switch assembly.

With reference to FIG. 1, the main winding 105, the start winding 110, and the start capacitor 115 are conventional components of a capacitor-start induction motor. It is envisioned that other components can be added to the motor 100 (see, for example, FIG. 8), and FIG. 1 is meant only to be a representative induction motor capable of being used with the electronic switch assembly 120.

Figure 3:
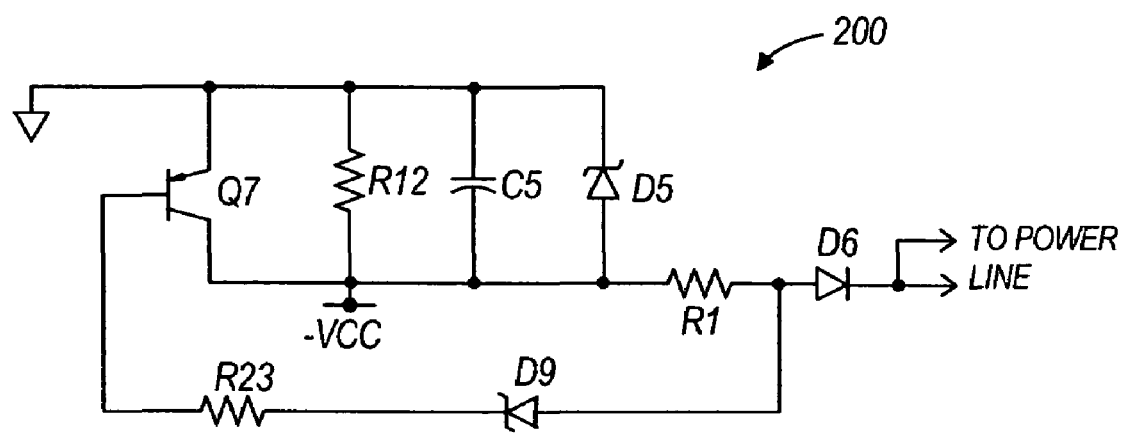
FIG. 3 is an electrical schematic of an exemplary power source capable of being used in the electronic switch assembly of FIG. 2.
Figure 2:
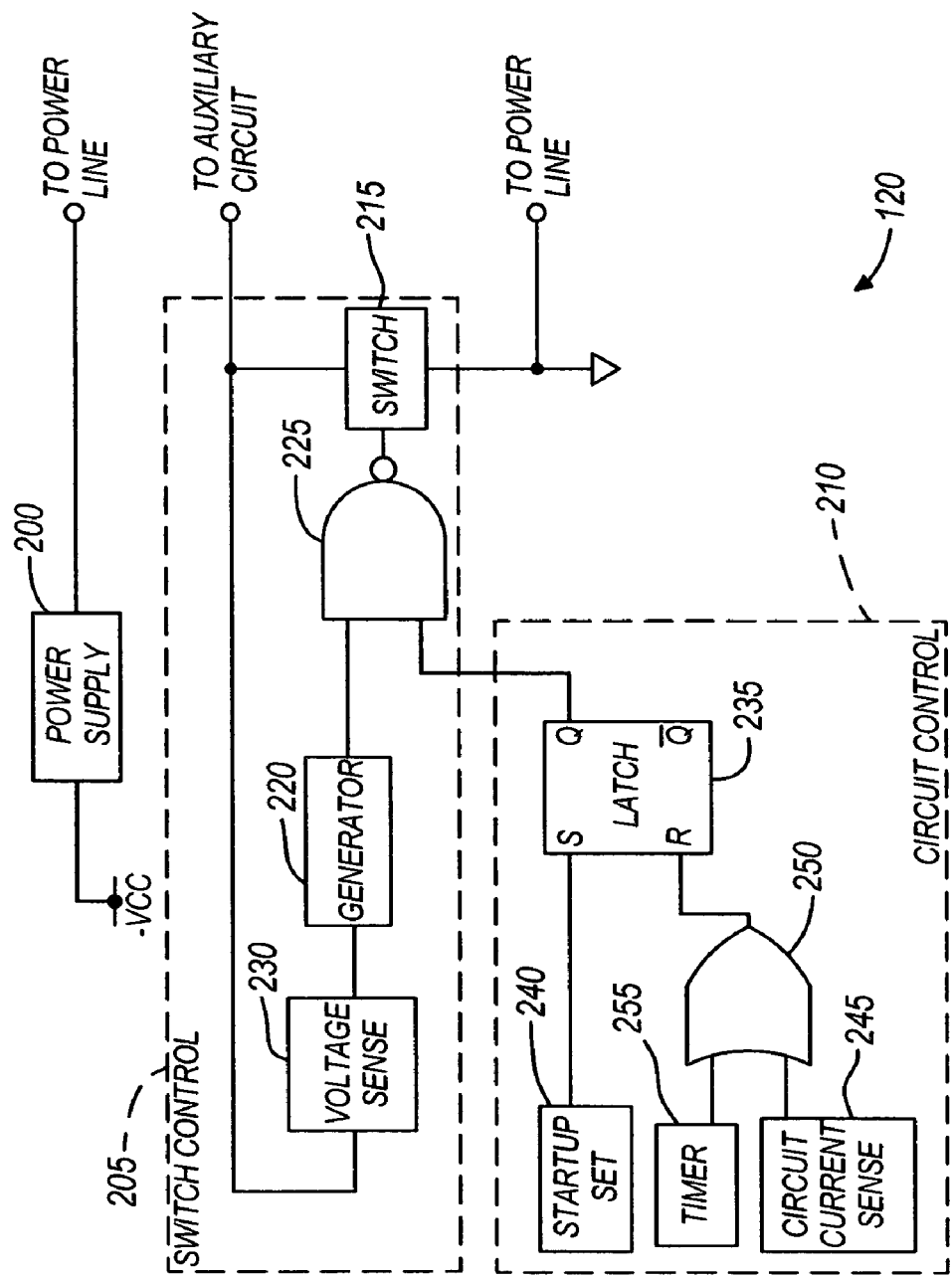
FIG. 2 is a block diagram of a representative electronic switch assembly capable of being used in the circuit shown in FIG. 1.
Figure 4:
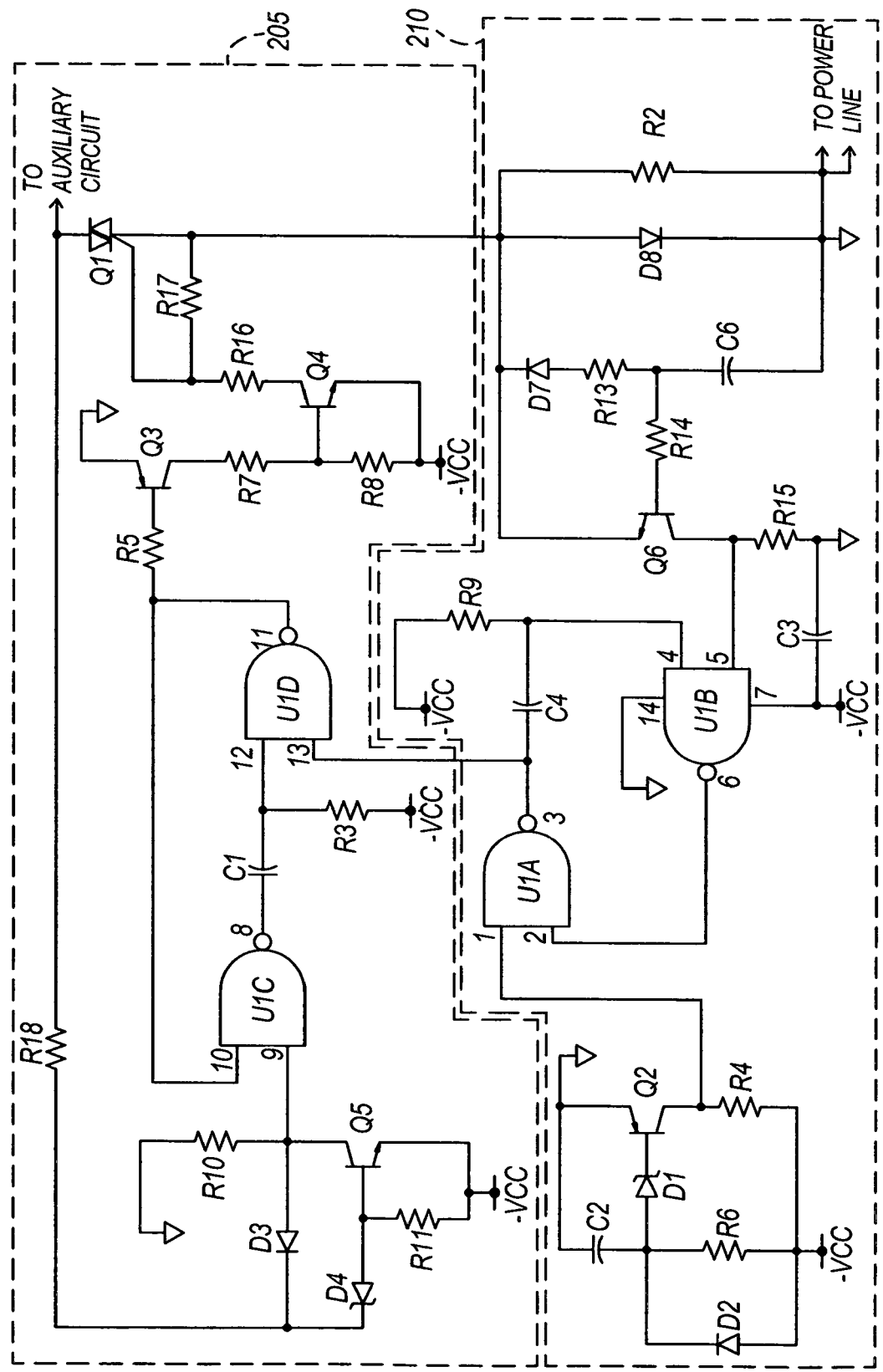
FIG. 4 is an electrical schematic of an exemplary switch control block and circuit control block capable of being used in the electronic switch assembly of FIG. 2.

FIG. 2 shows a block diagram of one construction of the electronic switch assembly 120. With reference to FIG. 2, the electronic switch assembly includes a power supply 200, a switch control block 205, and a circuit control block 210. FIGS. 3 and 4 are detailed electric schematics showing one exemplary electronic switch assembly 120.

The power supply 200 receives power (e.g., 115 VAC or 230 VAC power) from a power source and provides a regulated (i.e., a constant or consistent) voltage. For the construction shown in FIG. 2, the power supply 200 is connected to the power line and provides a direct current (e.g., a −5 VDC) power.

FIG. 3 is a detailed schematic showing one exemplary power supply 200 capable of being used with the electronic switch 120. With reference to FIG. 3, the power supply 200 includes resistors R1, R12, and R23; capacitor C5; diode D6; Zener diodes D5 and D9; and transistor Q7. During operation, when a positive half-cycle voltage is across the power supply 200, diode D6 blocks current through the power supply. When a negative half-cycle voltage is across the power supply 200, diode D6 conducts causing current to flow through resistor R1, thereby charging capacitor C5. Zener diode D5 begins conducting when capacitor C5 achieves a voltage determined by the Zener diode D5, thereby limiting the voltage across capacitor C5. Resistor R12 dissipates the charge of capacitor C5 when power is removed from the power supply 200, allowing the electronic switch assembly 120 to reset.

One feature of the circuit shown in FIG. 3 is that the circuit prevents the electronic switch 120 from working should the motor 100 be hooked to the wrong supply voltage. To provide some background, motor manufactures frequently design motors for dual voltage operation (e.g., 115 or 230 VAC operation) to keep the number of different motor models produced to a minimum. A common mistake by technicians is to hook a 115 VAC configured motor to a 230 VAC power line. When power is applied to the motor, the electronic switch will perform as normal and the motor will start (if there were no voltage clamp circuit). When the switch circuit turns off the start winding, however, the triac will need to block a large voltage (e.g., 1200 V). The power supply clamp keeps the motor from starting and, thus, the triac is required to block a much relatively smaller voltage (e.g., 350 V). Because the motor did not start, the clamp circuit has the additional benefit of alerting the installer that something is wrong.

Referring once again to FIG. 3, transistor Q7, resistor R23, and Zener diode D9 form the power supply clamp circuit. More specifically, Zener diode D9 has a set reverse breakdown voltage (e.g. 200 VDC) that results in the Zener diode conducting when the voltage applied to the power supply 200 is greater than the designed motor voltage (e.g., 130 VAC). When Zener diode D9 conducts, transistor Q7 switches on, thereby shorting the power supply. This circuit prevents the electronic switch assembly 120 from working should the motor be hooked to the wrong supply voltage by keeping the power supply 200 from powering the circuit.

Referring again to FIG. 2, the electronic switch assembly 120 includes a switch control block 205. The switch control block 205 includes a switch 215 connected in series with the circuit to be controlled. For the construction shown, the switch 215 is connected in series with the start winding 110 and the start capacitor 115. The switch 215 can be any electronic switch that prevents/allows current through the switch 215 in response to a control signal. An example switch 215 is a triac. In one specific construction the electronic switch 215 is an "AC Switch" brand switch, Model No. ACST8-8C, produced by ST Mircoelectronics of France, which also provides a high voltage clamping device to the triac in the same package to give the triac better line transient immunity and ability to switch inductive loads. Unless specified otherwise, the switch 215 for the description below is a triac.

Referring again to the construction shown in FIG. 2, the switch control block 205 includes a generator 220, and NAND gate 225. The generator 220 provides a signal to the NAND gate 225, which compares the generated signal with a signal from the circuit control block 210 (described below). The result of the NAND gate 225 controls the switch 215. Before proceeding further, it should be noted that, while the electronic switch shown is described with the NAND gate 225, the circuit can be readily redesigned for other gate types.

When the switch 215 is a triac, the generator 220 can be a pulse generator and the switch control 205 can also include a voltage sense circuit 230. Generally speaking, a triac is a bidirection gate controlled thyristor capable of conducting in either direction in response to a gate pulse. Therefore, the triac does not require a fixed control (or gate) voltage to allow current through the triac. Instead, the generator 220 can be a pulse generator that provides control pulses. To assist the pulse generator, the switch control block 205 includes the voltage sense circuit 230. The voltage sense circuit 230, generally, monitors the voltage applied to the switch 215 (i.e., the applied voltage to the auxiliary circuit) and generates pulses based on the applied voltage. For example, the voltage sense circuit 230 can monitor the voltage applied to the triac and generate pulses (also referred to as gating pulses) in relation to the zero crossings of the applied voltage. The pulses are applied to the NAND gate 225. The NAND gate 225 decides whether a gating pulse should or should not be applied to the triac switch 215 based on the conditions of the circuit control block 210, the result of which controls current through the triac 215. It is envisioned that the voltage sense circuit 230 and the generator 220 can be designed differently for other types of gate logic and other types of switches (e.g., other types of electronic devices).

Figure 5:
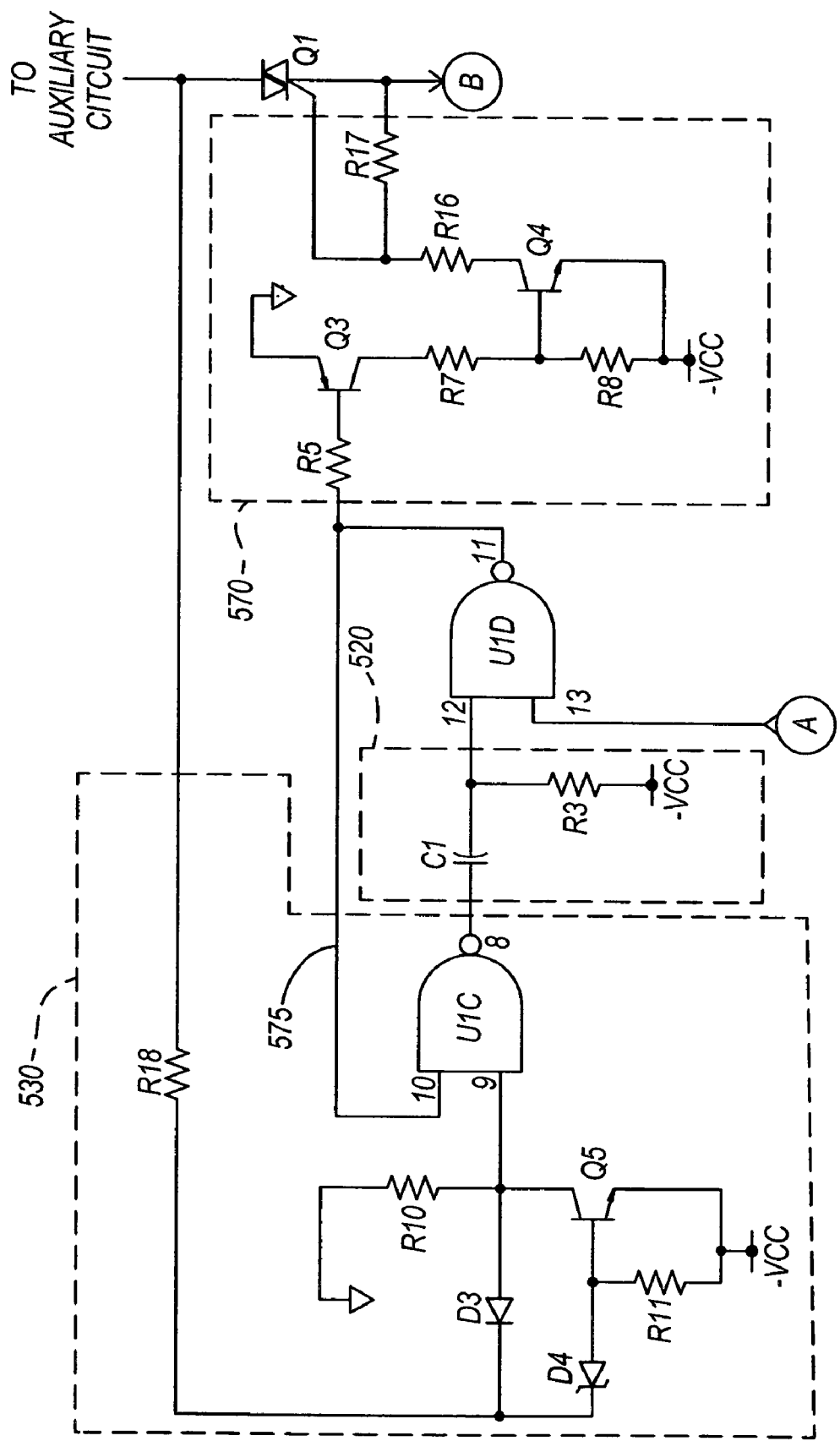
FIG. 5 is an electrical schematic of a portion of the electrical schematic shown in FIG. 4 and, specifically, is an electrical schematic of a voltage sense circuit, a generator circuit, a NAND gate, and a switch driver.

FIG. 5 is a detailed schematic showing one exemplary switch control block including a triac Q1, a triac voltage sense circuit 530, a pulse generator 520, a NAND gate U1D, and a switch driver 570. The triac voltage sense circuit 530 includes resistors R10, R11, R18, R19, R20, R21, and R22; diode D3; Zener diode D4; transistor Q5; and NAND gate U1C. The pulse generator 520 includes capacitor C1 and resistor R3. The output driver 570 includes resistor R5, R7, R8, R16, and R17; and transistors Q3 and Q4.

One method to keep the cost of an electronic circuit as low as possible is to keep the current supplied by the power supply as low as possible. One way to help accomplish this in an electronic switch circuit is to use a triac as the switch 215. A triac has the benefit of being a bidirectional gate controlled thyristor that only requires repetitive pulses to continuously conduct. Therefore, rather than providing a continuous signal to the triac (i.e., via the NAND gate 225), the voltage sense circuit 530 and generator circuitry 520 only need to generate short continuous pulses (e.g., 25 μs) where each pulse is generated each half cycle of the voltage applied to the triac switch Q1.

With reference to FIG. 5, the voltage sense circuit 530 monitors the voltage across the triac (referred to as the triac voltage) and determines whether the absolute value of the triac voltage is greater a threshold (e.g., 5V). When the absolute value of the triac voltage is greater than the threshold, a logic 0 is applied to pin 9 of the NAND gate U1C, thereby resulting in a logic 1 being applied to pulse generator 520. The voltage at pin 8 begins charging capacitor C1 and pulls pin 12 high at NAND gate U1D. A logic 1 is applied to pin 12 of U1D for the time constant of capacitor C1 and resistor R3. Therefore, the result of the voltage sense circuit 530 and generator 520 circuitry is that pulses are provided to NAND gate U1D, the pulses are only generated when the triac voltage passes through zero voltage to the positive or negative threshold (i.e., are generated just after each zero crossing event), and the pulses are narrow relative to the AC cycle of the power source. The switch driver 570 drives the triac Q1 based on the output of NAND gate U1D. While not necessary, the switch driver 570 is used because the triac Q1 can float off of ground. The driver 570 prevents voltage from feeding back into NAND gates U1C and U1D if the triac Q1 does float.

A subtle feature of the circuit shown in FIG. 5 relates to the line labeled 575 in FIG. 5. Line 575 locks out the voltage sense circuit 530 when the pulse is being applied to the gate of the triac Q1. This feature makes sure the full current pulse is applied to the triac Q1 and, thus, prevents teasing the triac Q1 ON. More specifically, as the current pulse is applied to the gate, the triac Q1 will start conducting. The voltage across the main terminals of the triac Q1 will go to near zero without line 575. This can fool the voltage sensing circuit 530 into thinking the triac Q1 is fully conducting, and the circuit terminates the current pulse to the gate. Line 575 prevents this by forcing the NAND gate U1C to provide a logic 1 result during the time constant of resistor R3 and C1.

Before proceeding further it should be noted that, in some constructions, the voltage sense circuit 230, generator 220, and NAND gate 225 are not required. That is, the circuit control block 210 (discussed below) can directly control the switch 215.

Referring again to FIG. 2, the electronic switch assembly 120 includes a circuit control block 210. For the construction shown in FIG. 2, the control block 210 includes a latch 235, a startup set 240, a current sense circuit 245, an OR gate 250, and a limit timer 255. The latch 235, which is shown as an SR latch, provides outputs to the switch control block 205 based on values received at the latch inputs, which are shown as inputs S and R. The outputs determine whether the switch 215 is on or off. Other latches and other arrangements for the SR latch can be used (e.g., if NAND gate 225 is replaced by an AND gate).

Figure 6:
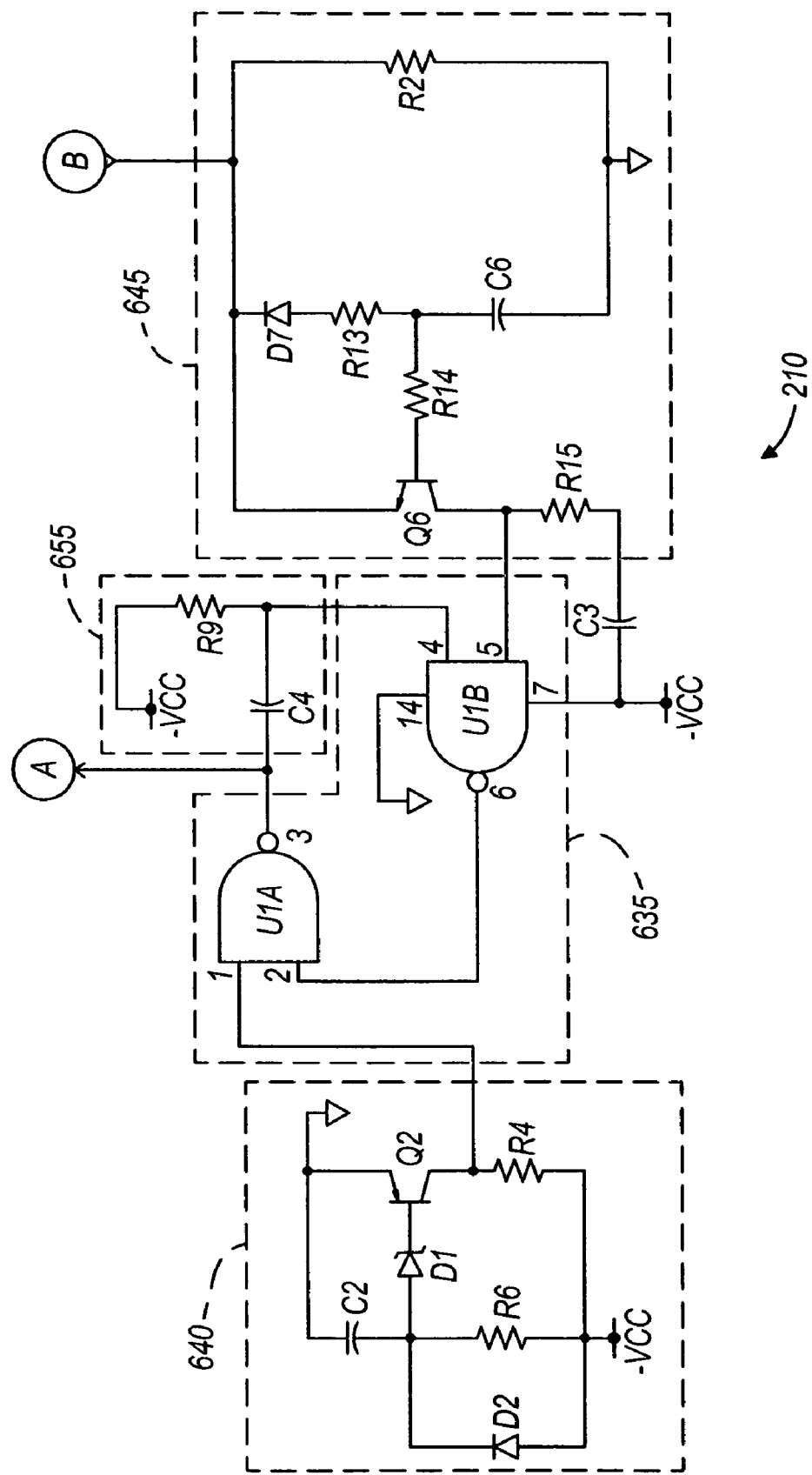
FIG. 6 is an electrical schematic of a portion of the electrical schematic shown in FIG. 4 and, specifically, is an electrical schematic of a start-up set circuit, a timer circuit, a current sense circuit, and a latch circuit.

The startup set 240 sets the latch in the set condition while the motor power supply 200, and consequently the electronic switch assembly, powers up. This ensures that the start winding 110 is energized for at least the duration of the set pulse, and that the current sense circuit 245 (discussed below) stabilizes before it is allowed to open switch 215. An exemplary start-up circuit 640 is shown in FIG. 6. The startup set circuit 640 includes resistors R4 and R6, capacitor C2, diode D2, Zener diode D1, and transistor Q2. The duration of the start-up period is set by how long it takes for capacitor C2 to charge to a voltage greater than the reverse breakdown voltage of Zener diode D1, and thus turn on transistor Q2.

There are two ways that the latch 235 can be reset: A) either the magnitude of the current through switch 215 (i.e., through the controlled circuit) is greater than a threshold or a timer times out. For example, if the rotor of the motor was locked on startup, the magnitude of the start winding current would never increase and the start winding would remain connected until the thermal switch protecting the motor finally opens. With this high current flowing continuously in the motor start winding, the triac switch and current sensing resistor (discussed below) would get very hot and would likely fail. To keep circuit costs low, the limit timer is added to terminate the start winding current after a time period (e.g., 1 to 1.5 seconds), whether the motor is started or not. An exemplary timer circuit 655 is shown in FIG. 6 as resistor R9 and capacitor C4, where the period for the timer circuit 655 is determined by the RC time constant of resistor R9 and capacitor C4. The timer changes the value of the signal (e.g., from a logic 0 to a logic 1) provided to the OR gate 250 (FIG. 2) after the time period.

Also provided to OR gate 250 is the result of the current sense circuit 245. Referring again to FIG. 2, the current sense circuit 245 senses the current through the switch 215 and compares the sensed value to a threshold. The result of the OR gate is provided to the latch 235, thereby controlling the latch 235, the NAND gate 225, and ultimately the switch 215. More specifically, if either the current sense circuit 245 or the limit timer 255 generates a logic 1, the SR latch resets, thereby controlling the NAND gate 225 and the switch 215. Before proceeding further, it should be noted that either the timer 255 or the current sense circuit 245 can be removed from the circuit control block 210. Additionally, in other constructions, other sensors or circuits can be used in place of the current sense circuit 245 (e.g., a voltage sensor) and the current sense circuit 245 can sense other circuits (e.g., the main winding circuit) or components.

FIG. 6 is a detailed schematic showing one exemplary circuit control block including set/reset latch circuit 635, startup set circuit 640, timer circuit 655, and current sense circuit 645. The set/reset latch circuit 635 includes NAND gates U1A and U1B. The current sense circuit 645 includes resistors R2, R13, R14, and R15; capacitor C6; diode D7; and transistor Q6. For the current sense circuit, current flows from triac Q1 (FIG. 5) through resistor R2 (FIG. 6). This creates a voltage drop across resistor R2, which is used for sensing. Current from the negative half cycle of the applied power flows through diode D7 and resistor R13 to charge capacitor C6. The charging of capacitor C6 relates to the voltage drop across resistor R2. When the voltage drop across resistor R2 is greater than a varying threshold, switch Q6 activates and pulls pin 5 of U1B low. This results in the reset of latch 635 and, then, latch 635 provides a logic 0 to NAND gate U1D, thereby deactivating triac Q1.

One feature of the current sense circuit 645 is that the circuit 645 scales the switch-out point based on the initial start winding current. To provide some background, during low line conditions, the start winding current is lower and, during high line conditions, the start winding current is higher. This can potentially create a switch-out speed error. To compensate for this, the first two or three cycles of start winding current charges capacitor C6 up to a value 0.7 volts (i.e., the diode forward drop) less than the peak voltage across the current sensing resistor R2. This sets the trip threshold value for the circuit. When the start winding current magnitude rapidly grows as the motor reaches operating speed, the voltage from base to emitter on transistor Q6 becomes sufficient to turn transistor Q6 ON. Therefore, the current sense circuit 245 scales the switch-out point to detect when the current of the auxiliary circuit flares.

One feature of the electronic switch assembly shown in FIG. 4 is that the assembly uses only three connections for connecting to the motor. Moreover, each connection is readily available. This reduces the complexity of adding the switch assembly shown in FIG. 4, and potentially reduces assembly time. However, for other constructions, more connections may be required.

As stated earlier and best shown in FIG. 1, the electronic switch assembly 120 can control current through the start winding 110 and the start capacitor 115 of a single-phase, capacitor-start induction motor. In operation, as power is applied to the motor 100, the power supply 200 charges and, when charged, the electronic switch assembly 120 energizes.

As the voltage applied to the start winding 110 (and the electronic switch assembly 120) passes through zero, the voltage sense circuit 230 and generator 220 senses voltage on the switch 215 and generates pulses in relation to the zero crossings of the voltage. The pulses are provided to NAND gate 225.

The NAND gate 225 receives a control signal from latch 235. Based on the control signal, the NAND gate 225 triggers (or "re-triggers") the switch 215 into conduction. For the construction shown, when the NAND gate 225 receives a logic 1 from the latch 235, the switch 215 conducts, and, when the NAND gate 225 receives a logic 0 from the latch 235, the switch 215 prevents current through the auxiliary circuit.

The startup set 240 forces the switch 215, via the latch 235 and NAND gate 225, to conduct for a time interval after the power supply energizes the electronic switch assembly. The current sense circuit 245 monitors the magnitude of the current flowing through the switch assembly. When the magnitude is greater than a threshold, the current sense circuit 245 forces, via OR gate 250, latch 235, and NAND gate 225, the switch 215 to prevent current flow through the auxiliary circuit (i.e., to "open" switch 215). Should the motor not come up to speed within a time interval, the timer 255 forces, via OR gate 250, latch 235, and NAND gate 225, the switch 215 to prevent current flow through the auxiliary circuit. Preventing current flow through the auxiliary circuit prevents current flow through the start winding 110 and the start capacitor 115.

Figure 7:
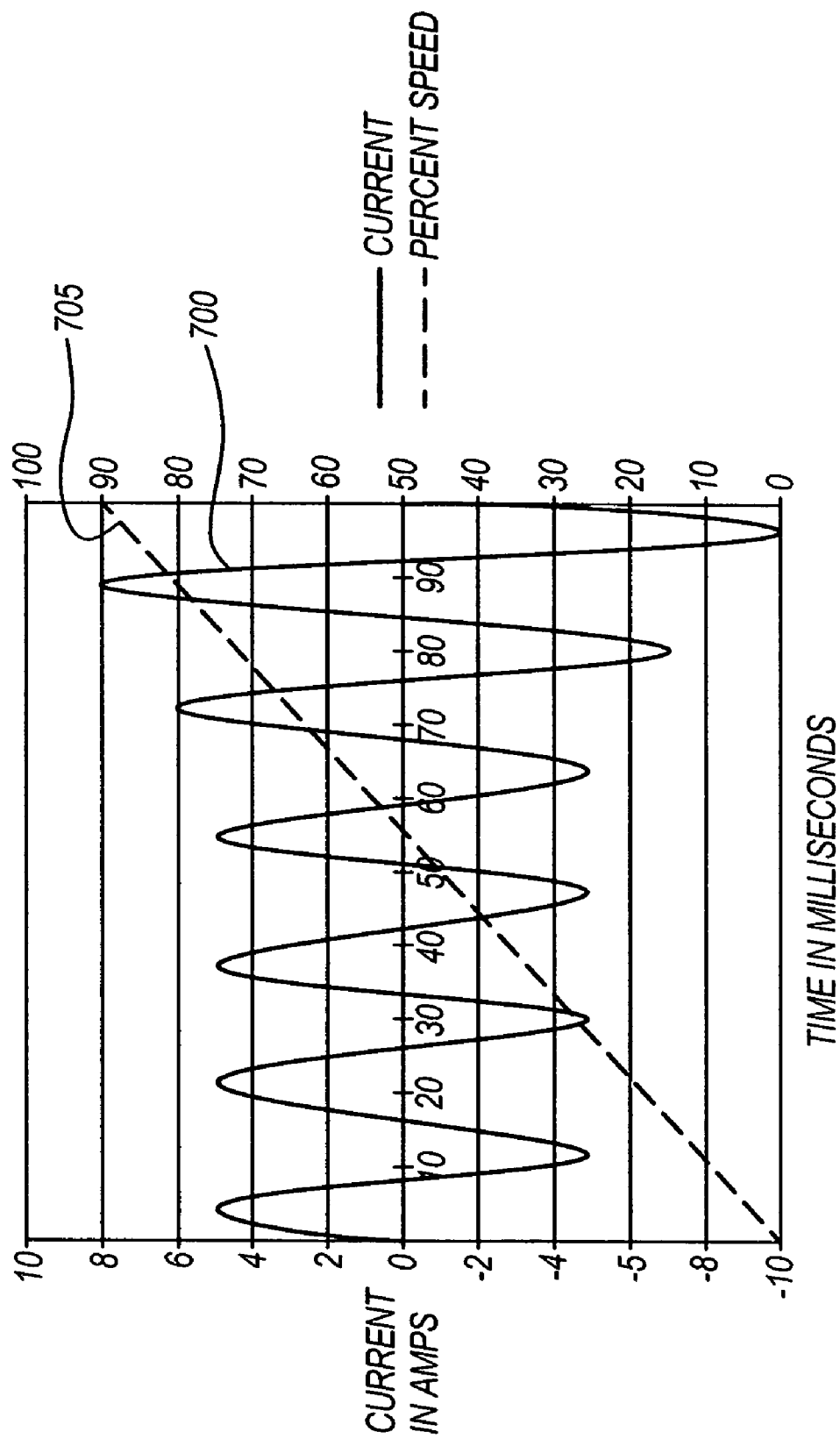
FIG. 7 is a graph comparing a current in Amps through the auxiliary circuit of a single-phase, capacitor-start induction motor against time in milliseconds, and a percent speed of the motor against time in milliseconds.

The electronic switch assembly 120 senses the magnitude of the auxiliary circuit current to determine the appropriate switch-out point for the auxiliary circuit. FIG. 7 shows a representative auxiliary circuit current waveform 700. It can be seen that as the rotor speeds up (waveform 705), the magnitude of the auxiliary circuit current stays relatively constant until the motor nears running speed. As the motor approaches running speed, the magnitude of the current grows rapidly because the start winding is no longer contributing to the output torque, but is rather fighting with the main winding. The electronic switch circuit 120 uses the flaring of the current to its benefit to deactivate the auxiliary circuit and, consequently, the start winding.

Figure 8:
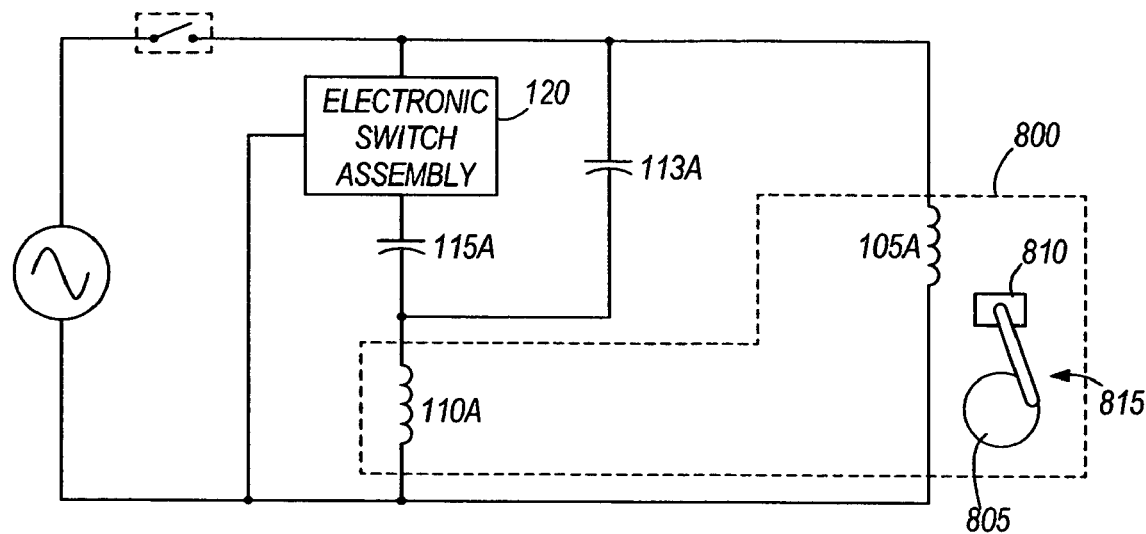
FIG. 8 is an electrical schematic of a motor coupled to a hermetic compressor, the motor including an electronic switch.

Referring now to FIG. 8, a motor 100A for controlling a hermetically-sealed compressor 800 is schematically shown with the electronic switch assembly 120A. The hermetically-sealed compressor 800 can be a conventional positive displacement type compressor (e.g., a rotary compressor, a piston compressor, a scroll compressor, a screw compressor, etc.) known in the art and is not discussed further herein. FIG. 8 schematically represents a single-phase, capacitor start, capacitor run induction motor 100A. The motor 100A mechanically controls the compressor 800 as is known in the art. The motor 100A includes a main winding 105A, an auxiliary winding 110A (sometimes referred to as the permanent split winding or even the start winding), and a rotor 805 (which can combine with a piston 810 to form a driven member 815), all of which are supported within a hermetically-sealed housing of the compressor 800. The motor 100A also includes a permanent split capacitor 113A, a start capacitor 115A (sometimes referred to as a boost capacitor), and the electronic switch assembly 120, all of which are supported outside of the hermetically-sealed housing. The electronic switch assembly 120 used with the motor 100A can be the same as the electronic switch assembly described in connection with FIGS. 2–6.

It is common to use a single-phase, permanent split capacitor (PSC) induction motor for operating a hermetically-sealed compressor. One deficiency of using the PSC motor is that the motor has difficulties starting the compressor if high head pressure is present. A switch circuit is sometimes included in the motor controller to switch-in the extra start capacitor 115A to boost the start torque of the motor, commonly referred to as a "hard-start kit." Typically, the start capacitor 115A is connected in parallel with the permanent capacitor 113A. Once started, the switch circuit switches the start capacitor 115A out for normal operation. For the compressor 800 shown in FIG. 8, the electronic switch assembly 120 is used to switch the extra start capacitor 115A in-and-out of the motor controller.

Figure 9:
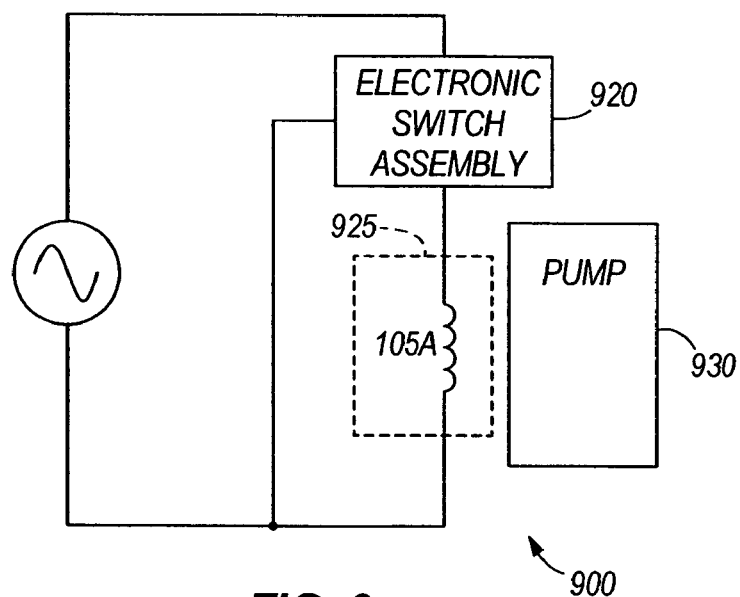
FIG. 9 is an electrical schematic of a sump pump including an electronic switch assembly.

Also as discussed earlier, an electronic switch assembly 120 (or aspects of the electronic switch assembly 120) can be used with other motor types and other electric machines, where the electronic switch assembly controls current through a circuit of the motor or machine. With reference to FIG. 9, a sump-pump assembly 900 has an electronic switch assembly 920 in a series circuit relationship with a pump motor 925, which can be an induction motor having one or more windings 105. The pump motor 925 is coupled to a pump 930 and is used for driving the pump 930.

Figure 10:
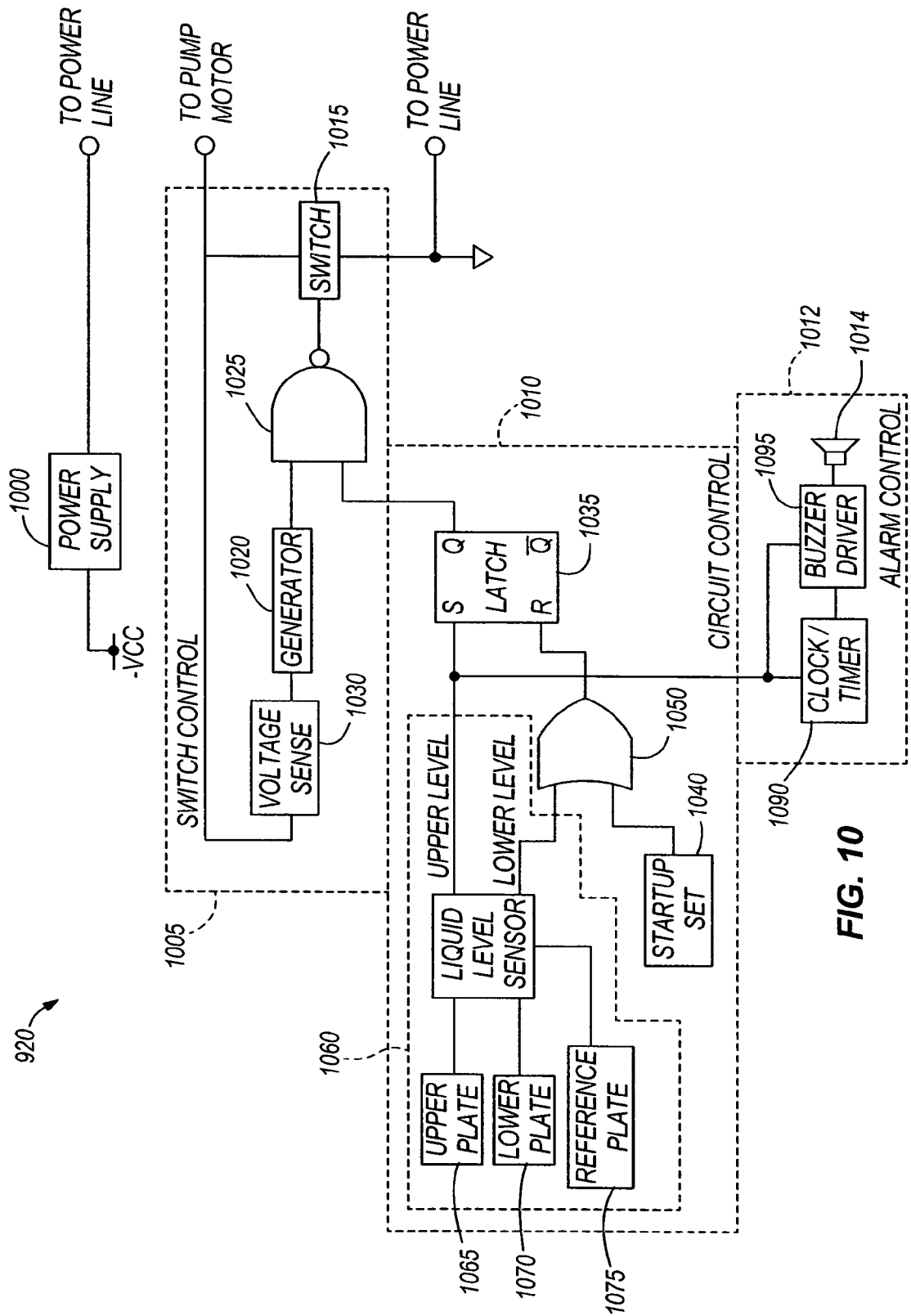
FIG. 10 is a block diagram of a representative electronic switch assembly capable of being used in the circuit shown in FIG. 9.
Figure 11:
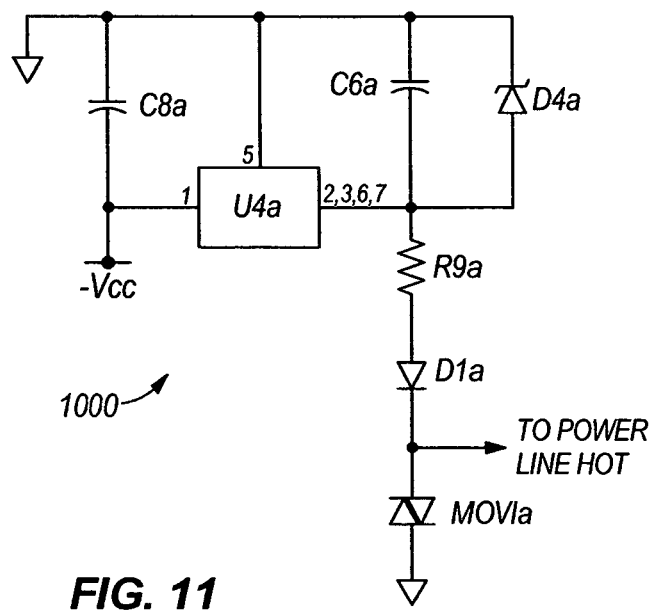
FIG. 11 is an electrical schematic of an exemplary power source capable of being used in the electronic switch assembly of FIG. 9.
Figure 12:
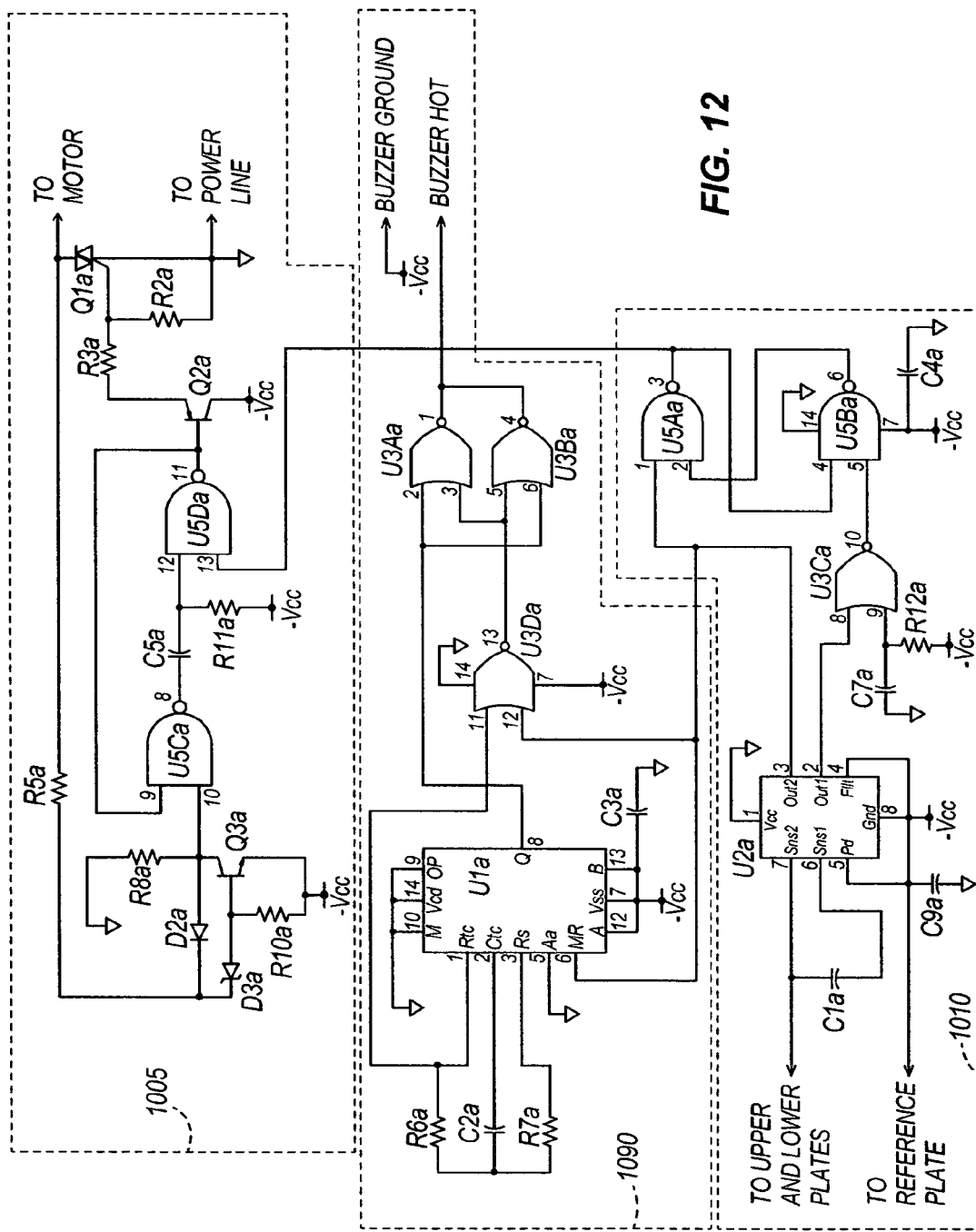
FIG. 12 is an electrical schematic of an exemplary switch control block and circuit control block capable of being used in the electronic switch assembly of FIG. 9.

FIG. 10 shows a block diagram of one construction of the electronic switch assembly 920. With reference to FIG. 10, the electronic switch assembly 920 includes a power supply 1000, a switch control block 1005, a circuit control block 1010, and an alarm control block 1012 for controlling an alarm 1014. FIGS. 11 and 12 are detailed electric schematics showing one exemplary electronic switch assembly 920.

The power supply 1000 receives power (e.g., 115 VAC or 230 VAC power) from a power source and provides a regulated (i.e., a constant or consistent) voltage. For the construction shown in FIG. 10, the power supply 1000 is connected to the power line and provides a direct current (e.g., a −5 VDC) power. FIG. 11 provides a detailed schematic showing one exemplary power supply 1000 capable of being used with the electronic switch 920. With reference to FIG. 11, the power supply 1000 includes resistor R9a, capacitors C6a and C8a, diode D1a, Zener diode D4a, surge arrestor MOV1a, and voltage regulator U4a. Before proceeding further, it should be understood that the power supply 200 or aspects of the power supply 200 (e.g., the voltage clamp of power supply 200) can replace the power supply 1000 in the electronic switch 920.

Referring again to FIG. 10, the electronic switch assembly 920 includes a switch control block 1005. The switch control block 1005 includes a switch 1015 connected in series with the circuit to be controlled. For the construction shown, the switch 1015 is connected in series with the pump motor 925. The switch 1015 can be any electronic switch that prevents/allows current through the switch 1015 in response to a control signal. An example switch 1015 is a triac. In one specific construction the electronic switch 1015 is an "AC Switch" brand switch, Model No. ACST8-8C, produced by ST Mircoelectronics of France, and discussed earlier. Unless specified otherwise, the switch 1015 for the description below is a triac.

Similar to the switch control block 205, the switch control block 1005 includes a generator 1020, and NAND gate 1025. The generator 1020 provides a signal to the NAND gate 1025, which compares the generated signal with a signal from the circuit control block 1010 (described below). The result of the NAND gate 1025 controls the switch 1015. Before proceeding further, it should be noted that, while the electronic switch shown is described with the NAND gate 1025, the circuit can be readily redesigned for other gate types.

When the switch 1015 is a triac, the generator 1020 can be a pulse generator and the switch control 1005 can also include a voltage sense circuit 1030. Generally speaking, a triac is a bidirectional gate controlled thyristor capable of conducting in either direction in response to a pulse. Therefore, the triac does not require a fixed control (or gate) voltage to allow current through the triac. Instead, the generator 1020 can be a pulse generator that provides control pulses. To assist the pulse generator, the switch control block 1005 includes the voltage sense circuit 1030. The voltage sense circuit 1030, generally, monitors the voltage applied to the switch 1015 and generates pulses based on the applied voltage. For example, the voltage sense circuit 1030 can monitor the voltage applied to the triac and generate pulses (also referred to as gating pulses) in relation to the zero crossings of the applied voltage. The pulses are applied to the NAND gate 1025. The NAND gate 1025 decides whether a gating pulse should or should not be applied to the triac switch 1015 based on the conditions of the circuit control block 1010, the result of which controls current through the triac 1015. It is envisioned that the voltage sense circuit 1030 and the generator 1020 can be designed differently for other types of gate logic and other types of switches (e.g., other types of electronic devices).

Figure 13:
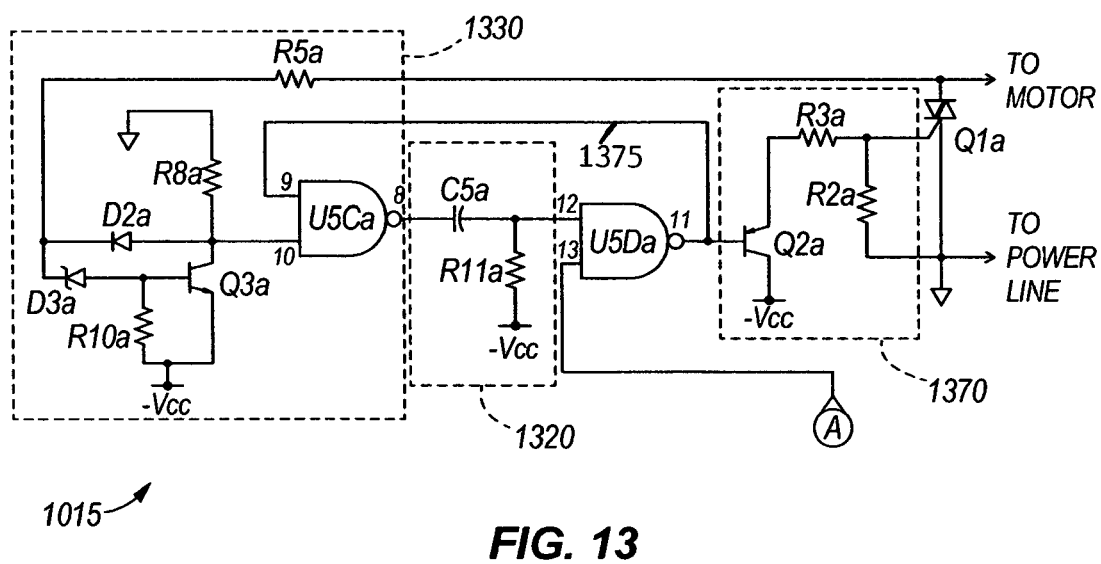
FIG. 13 is an electrical schematic of a portion of the electrical schematic shown in FIG. 12 and, specifically, is an electrical schematic of a voltage sense circuit, a generator circuit, a NAND gate, and a switch driver.

FIG. 13 is a detailed schematic showing one exemplary switch control block 1015 including a triac Q1a, a triac voltage sense circuit 1330, a pulse generator 1320, a NAND gate U5Da, and a switch driver 1370. The triac voltage sense circuit 1330 includes resistors R5a, R8a, and R10a; diode D2a; Zener diode D3a; transistor Q3a; and NAND gate U5Ca. The pulse generator 1320 includes capacitor C5a and resistor R11a. The output driver 1370 includes resistors R2a and R3a; and transistor Q2a.

As discussed earlier, one method to keep the cost of an electronic circuit as low as possible is to keep the current supplied by the power supply as low as possible. One way to help accomplish this in an electronic switch circuit is to use a triac as the switch 1015. A triac has the benefit of being a bidirectional gate controlled thyristor that only requires repetitive pulses to continuously conduct. Therefore, rather than providing a continuous signal to the triac (i.e., via the NAND gate 1025), the voltage sense circuit 1330 and generator circuitry 1320 only need to generate short continuous pulses (e.g., 25 µs) where each pulse is generated each half cycle of the voltage applied to the triac switch Q1a.

With reference to FIG. 13, the voltage sense circuit 1330 monitors the voltage across the triac (referred to as the triac voltage) and determines whether the absolute value of the triac voltage is greater a threshold (e.g., 5V). When the absolute value of the triac voltage is greater than the threshold, a logic 0 is applied to pin 9 of the NAND gate U5Ca, thereby resulting in a logic 1 being applied to pulse generator 1320. The voltage at pin 8 begins charging capacitor C5a and pulls pin 12 high at NAND gate U5Da. A logic 1 is applied to pin 12 of U5Da for the time constant of capacitor C5a and resistor R11a. Therefore, the result of the voltage sense circuit 1330 and generator 1320 circuitry is that pulses are provided to NAND gate U5Da, the pulses are only generated when the triac voltage passes through zero voltage to the positive or negative threshold (i.e., are generated just after each zero crossing event), and the pulses are narrow relative to the AC cycle of the power source. The switch driver 1370 drives the triac Q1a based on the output of NAND gate U5Da.

Similar to the circuit shown in FIG. 5, FIG. 13 includes line 1375. Line 1375 locks out the voltage sense circuit 1330 when the pulse is being applied to the gate of the triac Q1a.

This feature makes sure the full current pulse is applied to the triac Q1a and, thus, prevents teasing the triac Q1a ON. More specifically, as the current pulse is applied to the gate, the triac Q1a will start conducting. The voltage across the main terminals of the triac Q1a will go to near zero without line 1375. This can fool the voltage sensing circuit 1330 into thinking the triac Q1a is fully conducting, and the circuit terminates the current pulse to the gate. Line 1375 prevents this by forcing the NAND gate U5Ca to provide a logic 1 result during the time constant of resistor R11a and capacitor C5a.

Before proceeding further it should be noted that, in some constructions, the voltage sense circuit 1030, generator 1020, and NAND gate 1025 are not required. That is, the circuit control block 1010 (discussed below) can directly control the switch 1015.

Referring again to FIG. 10, the electronic switch assembly 920 includes a circuit control block 1010. For the construction shown in FIG. 10, the control block 1010 includes a latch 1035, a startup reset 1040, an OR gate 1050, and a liquid level sense circuit 1060. However, other circuits can be used in addition to or in place of the circuits described in connection with FIG. 10. For example, other sense circuits and/or other control parameters can be used to control the electronic switch instead of the liquid level sensed by the liquid level sense circuit 1060 (discussed further below).

The latch 1035, which is shown as an SR latch, provides outputs to the switch control block 1005 based on values received at the latch inputs, which are shown as inputs S and R. The outputs determine whether the switch 1015 is on or off. Other latches and other arrangements for the SR latch can be used (e.g., if NAND gate 1025 is replaced by an AND gate).

The startup reset 1040 sets the latch in the reset condition while the power supply 1000, and consequently the electronic switch assembly, powers up. This ensures that the pump motor 925 is deenergized for at least the duration of the reset pulse, and that the liquid level sense circuit 1060 (discussed below) stabilizes before it is allowed to control switch 1015. An exemplary start-up circuit 1440 is shown in FIG. 14 as resistor R12a and capacitor C7a.

As will be discussed below, the liquid level sense circuit 1060 uses three plates to sense the level of water in a vessel (such as a crock) and provides a first output to the latch 1035 and a second output to the OR gate 1050. The result of the OR gate 1050 is also provided to the latch 1035. Therefore, the control of the switch 1015, NAND gate 1025, and the latch 1035 is based on the liquid level sense circuit 1060.

Figure 14:
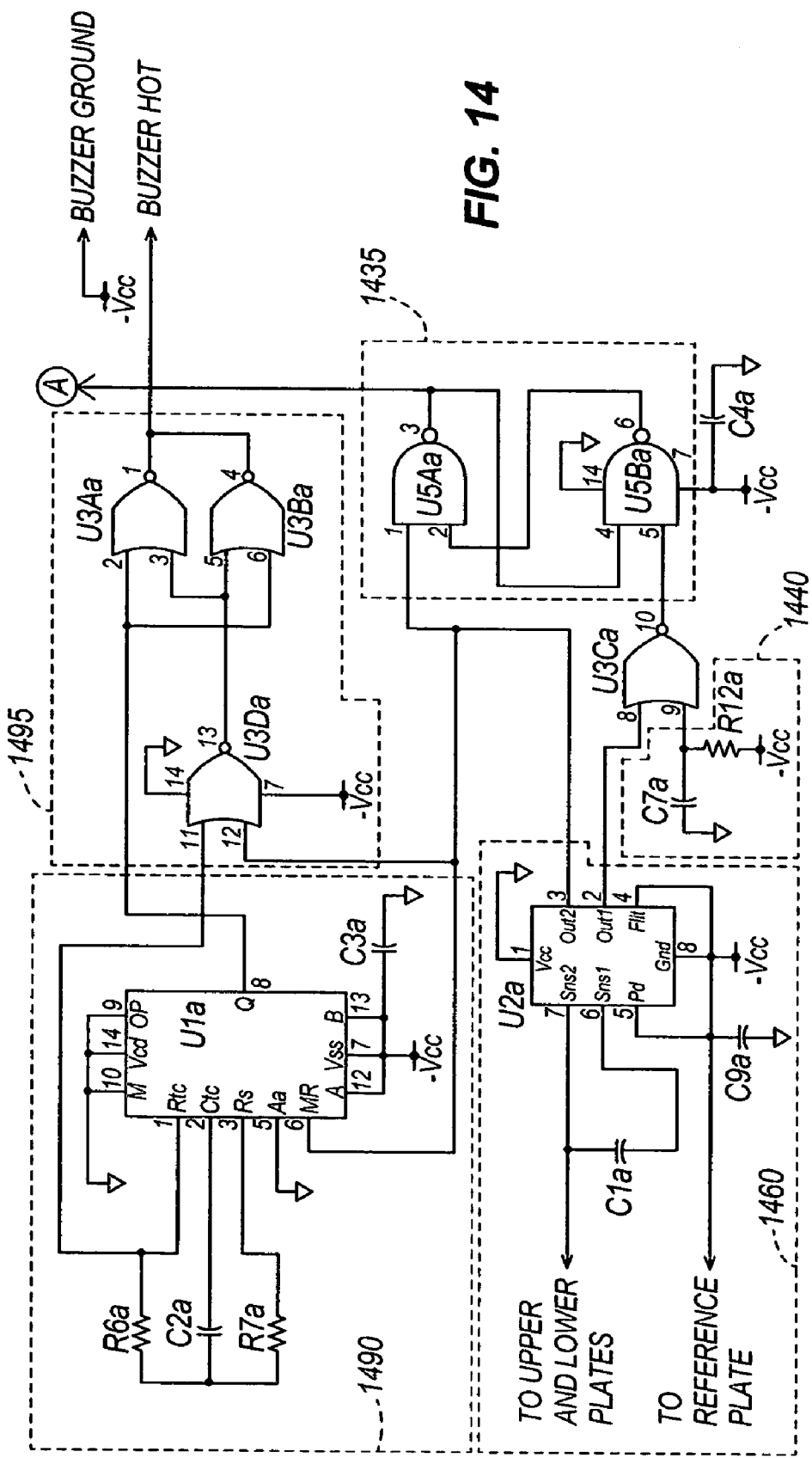
FIG. 14 is an electrical schematic of a portion of the electrical schematic shown in FIG. 12 and, specifically, is an electrical schematic of a liquid level sense circuit, start-up reset circuit, an alarm driver circuit, and a latch circuit.

FIG. 14 is a detailed schematic showing one exemplary circuit control block including set/reset latch circuit 1435, startup reset circuit 1440, NOR gate U3Ca, and liquid level sense circuit 1460. The set/reset latch circuit 1435 includes NAND gates U5Aa and U5Ba. The liquid level sense circuit 1460 includes an upper plate 1065 (FIG. 10), a lower plate 1070, a reference plate 1075, liquid level sensor U2a (FIG. 13), and capacitors C1a and C9a. The liquid level sensor U2a is a charge-transfer sensor, model no. QProx QT114, sold by Quantum Research Group Ltd. The liquid level sensor U2a acts as a capacitive sensor over multiple capacitor plates (i.e., the upper, lower, and reference plates). The capacitance across the upper, lower, and reference plates 1065, 1070, and 1075 vary depending on whether water surrounds one or more of the plates. As the liquid level sensor U2a measures capacitance of various levels, it provides varying outputs on lines OUT1 and OUT2. More specifically, if liquid covers the lower plate 1070, the sensed capacitance is greater than a first threshold and a first signal indicating the first threshold has been passed is provided on OUT1. The signal of OUT1 is provided to the reset of the latch 1435. If liquid covers the upper plate 1465, the sensed capacitance is greater than a second threshold and a second signal indicating the second threshold has been passed is provided on OUT2. The value of OUT2 is provided to the set of latch 1435 and the timer 1490.

With reference to FIG. 10, when the liquid covers the upper plate 1065, the liquid level sensor provides a value to the latch 1035, setting the latch 1035. The setting of the latch 1035 provides an "ON" signal to NAND gate 1025, which results in the NAND gate 1025 pulsing the triac 1015 based on the pulses provide by the pulse generator 1020 to the NAND date 1025. Therefore, the "ON" signal provided by the latch 1035 results in the triac 1015 closing, the motor 925 operating, and the pump 930 pumping. Once the water goes below the lower plate 1070 capacitance falls and the latch 1035 resets, thereby providing an "OFF" signal. The issuance of the OFF signal results in the triac 1015 preventing current from flowing through the switch 1015 to the motor 925, and the motor 925 turning off.

The electronic switch assembly 920 includes an alarm control block 1012 comprising a timer 1090 and an alarm driver 1095. The timer, which includes resistors R6a and R7a, capacitors C2a and C3a, and counter U1a of FIG. 14, receives an output from the liquid level sense circuit 1060 indicating whether a liquid is higher than the upper plate 1065 of the liquid level sensor 1060. If the liquid is higher than the upper plate 1065, then the timer 1090 starts. If the liquid is lower than the upper plate 1065, the timer 1090 resets. If the timer 1090 counts a predetermined time period, the timer 1095 provides an output to the alarm driver 1095, which drives the audible speaker 1014. The driver includes NOR gates U3Aa, U3Ba, and U3Da of FIG. 14.

Figure 15:
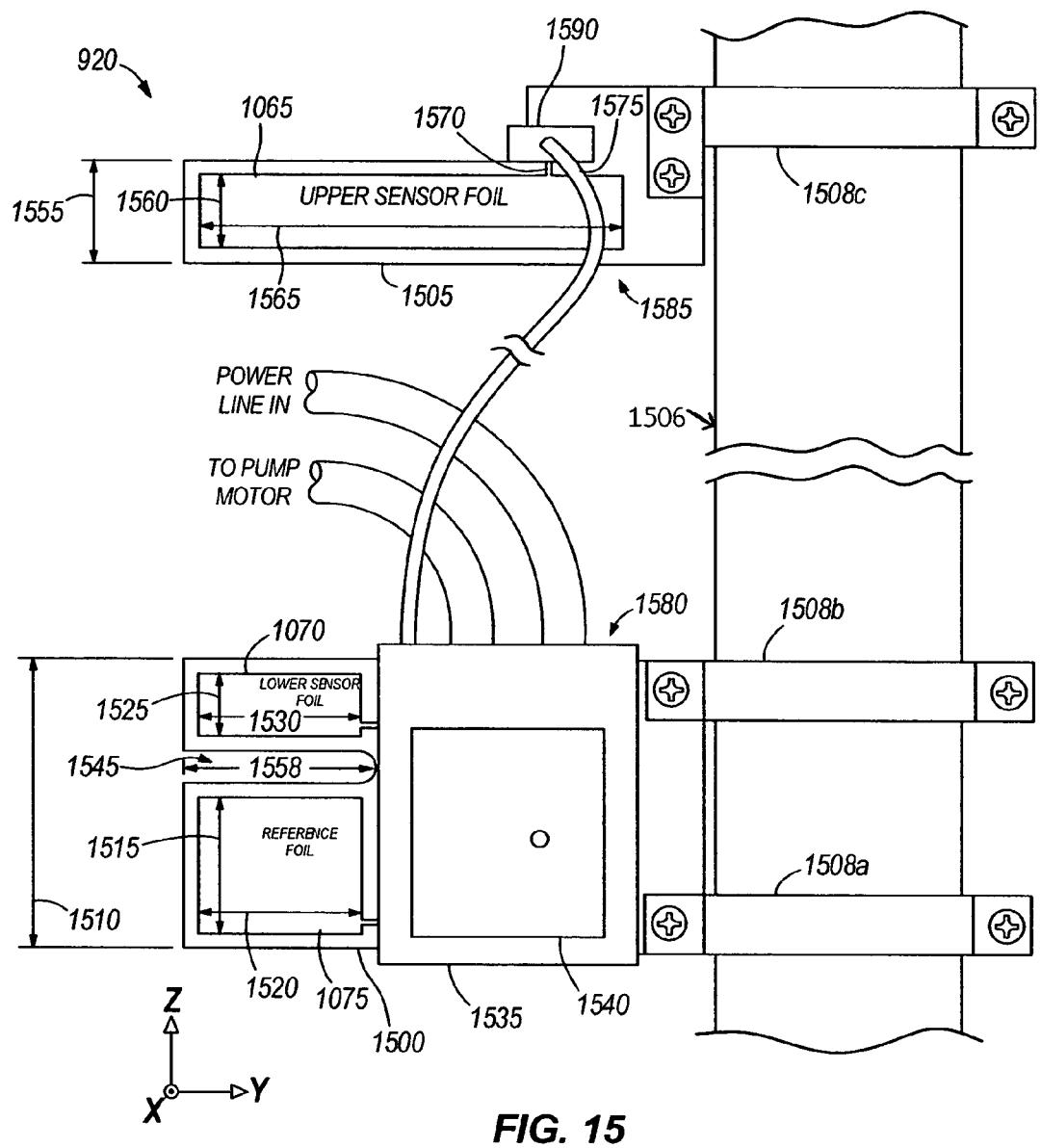
FIG. 15 is a side view of one construction of the electronic switch assembly shown in FIG. 10.

Referring now to FIG. 15, the figure shows a side view of one construction of the electronic switch assembly 920. As previously discussed, the electronic switch assembly 920 senses a level of a liquid to be pumped and controls the current to the pump motor 925 based on, among other things, the sensed level of the liquid. For the construction of FIG. 15, the liquid-level sense circuit 1060 is disposed on two printed circuit boards (PCBs) 1500 and 1505, which sense the level of a liquid in a vessel (e.g., a sump crock) along an axis (e.g., along the z-axis of FIG. 15). The two PCBs 1500 and 1505 are secured to a support member (e.g., the drain outlet pipe 1506) by an attachment member 1508 (e.g., clamps, bolts, and nuts). The first PCB 1500 includes a height 1510 along the z-axis, a length along the y-axis, and a width along the x-axis. The first PCB 1500 can have multiple layers (e.g., two layers) where a reference foil (acting as the reference plate 1075) and a lower sensor foil (acting as the lower plate 1070) are disposed between a first and second layer. The reference plate has a height 1515 and a length 1520, and the lower plate has a height 1525 and a length 1530. The reference and lower plates 1075 and 1070 (and the upper plate 1065 discussed further below) couple to the other electrical components of the electronic switch assembly 920, which are also mounted on the first PCB 1500 and are housed by a housing 1535 (e.g., plastic molded around a portion of the PCB 1500). A heat sink 1540 is coupled to the electronic switch assembly 920 and is exposed to the liquid for cooling the electronic switch assembly 920, particularly the triac 1015 (FIG. 10).

Referring again to FIG. 15, the first PCB 1500 includes a notch 1545 disposed between the heights 1515 and 1525 of the reference and lower plates 1075 and 1070. The notch has a length 1550 that is preferably greater than the lengths 1520 and 1530 of the reference and lower plates 1075 and 1070. In the specific construction shown, the length of the notch is from one of the edges of the first PCB 1500 to the housing 1535.

The second PCB 1505 includes a height 1555 along the z-axis, a length along the y-axis, and a width along the x-axis. The second PCB 1505 (and consequently the height 1555) is disposed above the first PCB 1500 (and consequently the height 1510) along the z-axis. The second PCB 1505 also can have multiple layers (e.g., two layers) where an upper sense foil (acting as the upper plate 1065) is disposed between a first and second layer. The upper plate has a height 1560 and a width 1565. The upper plate 1065 couples to the other electrical components of the electronic switch assembly 920 via conductors 1570 and 1575.

The buildup of slime and sludge over time contributes to the sensitivity of the switch points of the liquid level sense circuit 1060. The lower sense module 1580 is constructed such that the reference plate 1075 and the lower sense plate 1070 are separated by the notch 1545 in the first PCB 1500. This breaks the "leakage" path between the two sensing plates 1075 and 1070. There is still a path around the slot, but the length of the path is long enough that the capacitance will not be adversely affected. Similarly, the upper plate 1065 of the upper sense module 1585 is constructed such that the wire connection 1590 to the lower module 1580 and the attachment member 1508c are above the water line, thereby also breaking the "leakage" path between the reference and upper sense plates 1075 and 1060. It is believed that the connection point 1590 and the attachment member 1508c being above the water line should reduce slime and scale building around the connection point 1590 and the attachment member 1508c.

Thus, the invention provides, among other things, a new and useful electronic switch assembly and motor having the electronic switch assembly. The invention also provides, among other things, a hermetic compressor having an auxiliary circuit, where the auxiliary circuit includes a start boost capacitor and the electronic switch assembly. Even further, the invention provides, among other things, a pump assembly for pumping a liquid where the pump assembly comprises an electronic switch assembly connected to the motor to control the current through the motor. The embodiments described above and illustrated in the figures are presented by way of example only and are not intended as a limitation upon the concepts and principles of the invention. Various features and advantages of the invention are set forth in the following claims.

What is claimed is:

1. A compressor comprising:
   a winding circuit comprising a winding;
   a driven member driven in part by the winding;
   an auxiliary circuit connected in a parallel relationship with the winding circuit, the auxiliary circuit comprising an auxiliary circuit element and an electronic switch assembly connected in a series relationship such tat the electronic switch assembly controls the current through the auxiliary circuit element, the electronic switch assembly comprising
      an electronic switch, and
      a controller connected to the electronic switch to control the electronic switch, the controller comprising a current sensor that senses a current through the electronic switch, a scalar that generates a threshold based on the sensed current, and decision logic that controls the electronic switch based on the sensed current and the threshold; and
   wherein the scalar generates a threshold having a relation to the sensed current such that the decision logic detects when the sensed current flares.

2. A compressor as set forth in claim 1 wherein the current sensor comprises a resistor, wherein the scalar comprises a capacitor that charges to a voltage having a relation to the current through the resistor, the charged voltage having a relation to the threshold, and a switch that provides a signal to the decision logic when the voltage drop across the resistor is greater than the threshold.

3. A compressor as set forth in claim 1 wherein the auxiliary circuit element comprises a capacitor.

4. A compressor as set forth in claim 1 wherein the auxiliary circuit comprises first, second, and third circuits connected at a node, the first circuit comprising an auxiliary capacitor, the second circuit comprising an auxiliary winding, and the third circuit comprising the electronic switch assembly and the auxiliary circuit element connected in the series relationship, wherein the auxiliary circuit element comprises a boost capacitor.

5. A compressor as set forth in claim 4 wherein the driven member comprises a rotor coupled to a piston.

6. A compressor as set forth in claim 4 wherein the compressor is a hermetically sealed compressor comprising a housing, wherein the piston, rotor, winding, and auxiliary winding are supported within the housing, and wherein the auxiliary capacitor, boost capacitor, and electronic switch assembly are supported outside the housing.

7. A compressor as set forth in claim 1 wherein the electronic switch assembly further comprises a power supply connected to the controller, the power supply being configured to receive power from a power source and controllably power the controller, the power supply comprising a circuit clamp that obstructs power from powering the controller when the voltage of the received power is greater than a threshold, thereby preventing current through the auxiliary circuit element.

8. A compressor as set forth in claim 1 wherein the controller further comprises a generator that provides a signal, and wherein the decision logic controls the electronic switch further based on the generated signal.

9. A compressor as set forth in claim 8 wherein the electronic switch comprises a triac, and wherein the generated signal comprises a plurality of pulses.

10. A compressor comprising:
   a winding circuit comprising a winding;
   a driven member driven in part by the winding; and
   an auxiliary circuit connected in a parallel relationship with the winding circuit, the auxiliary circuit comprising an auxiliary circuit element and an electronic switch assembly electrically connected in a series relationship such that the electronic switch assembly controls the current through the auxiliary circuit element, the electronic switch assembly comprising
      a triac,
      a pulse generator that provides a first signal comprising a plurality of pulses,
      a current sensor that senses a current trough the switch, the current sensor providing a second signal based on the sensed current,
      a timer that provides a third signal, and
      decision logic connected to the pulse generator, the current sensor, the timer, and the triac, the decision logic generating a control signal that selectively controls the triac based on the first second, and third signals.

11. A compressor as set forth in claim 10 wherein the electronic switch assembly further comprises a circuit control comprising the current sensor and the timer, wherein the circuit control provides a fourth signal based on the second and third signals, and wherein the decision logic generates the control signal based on the first and fourth signals.

12. A compressor as set forth in claim 11 wherein the circuit control further comprises a voltage sense circuit comprising a sensor that senses the voltage across the triac.

13. A compressor as set forth in claim 12 wherein the pulses have a relation to the zero crossings of the sensed voltage.

14. A compressor as set forth in claim 11 wherein the circuit control comprises a delay preventing the opening of the triac during a second time period.

15. A compressor as set forth in claim 10 wherein the auxiliary circuit comprises first, second, and third circuits connected at a node, the first circuit comprising an auxiliary capacitor, the second circuit comprising an auxiliary winding, and the third circuit comprising the electronic switch assembly and the auxiliary circuit element connected in the series relationship, wherein the auxiliary circuit clement comprises a boost capacitor.

16. A compressor as set forth in claim 10 wherein the driven member comprises a rotor coupled to a piston.

17. A compressor as set forth in claim 16 wherein the compressor is a hermetically sealed compressor comprising a housing, wherein the piston, rotor, winding, and auxiliary winding are supported within the housing, and wherein the auxiliary capacitor, boost capacitor, and electronic switch assembly are supported outside the housing.

18. A compressor as set forth in claim 10 wherein the auxiliary circuit element comprises a capacitor.

* * * * *